US009326350B2

(12) United States Patent
Chang et al.

(10) Patent No.: US 9,326,350 B2
(45) Date of Patent: Apr. 26, 2016

(54) LIGHT-EMITTING DEVICE WITH MULTI-COLOR TEMPERATURE AND MULTI-LOOP CONFIGURATION

(71) Applicant: Everlight Electronics Co., Ltd., New Taipei (TW)

(72) Inventors: Chung-kai Chang, New Taipei (TW); Shih-Hua Pan, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 165 days.

(21) Appl. No.: 13/761,550

(22) Filed: Feb. 7, 2013

(65) Prior Publication Data

US 2014/0217428 A1 Aug. 7, 2014

(51) Int. Cl.

*H01J 1/62* (2006.01)
*H01J 63/04* (2006.01)
*H05B 33/14* (2006.01)
*H01L 25/075* (2006.01)
*H01L 33/50* (2010.01)

(52) U.S. Cl.

CPC ............ *H05B 33/14* (2013.01); *H01L 25/0753* (2013.01); *H01L 33/504* (2013.01); *H01L 2224/48137* (2013.01)

(58) Field of Classification Search

CPC ....... H01L 33/505; H01L 33/52; H01L 33/58; H01L 24/97; H01L 33/50; H01L 33/502; C09K 11/7774; C09K 11/0838; C09K 11/706; C09K 11/717; C09K 11/7706; C09K 11/7749; G03B 21/204; F21K 9/00

USPC ................................. 313/498–512, 112, 113

See application file for complete search history.

(56) References Cited

U.S. PATENT DOCUMENTS 8,783,887 B2 * 7/2014 Caruso et al. .................. 362/84
2004/0072106 A1 4/2004 Chua et al.
2011/0050071 A1 * 3/2011 Chung et al. .................... 313/46
2011/0116252 A1 5/2011 Agatani et al.
2011/0116253 A1 * 5/2011 Sugiyama ....................... 362/84
2011/0210658 A1 * 9/2011 Pan et al. ...................... 313/112
2011/0297981 A1 12/2011 Liao et al.
2011/0310614 A1 12/2011 Budike
2013/0250544 A1 * 9/2013 Zink et al. ....................... 362/84
2013/0258638 A1 * 10/2013 Wang et al. ..................... 362/84

FOREIGN PATENT DOCUMENTS

CN 102110682 6/2011
CN 202511031 10/2012
CN 102797985 11/2012
CN 102911668 A 2/2013
WO WO2011108588 9/2011

* cited by examiner

*Primary Examiner* — Nimeshkumar Patel
*Assistant Examiner* — Kevin Quarterman
(74) *Attorney, Agent, or Firm* — Han IP Corporation

(57) ABSTRACT

A light-emitting device with multi-color temperature and multi-loop configuration is provided. The light-emitting device comprises a substrate, multiple light sources disposed on the substrate, and a light-emitting unit covering the light sources and at least a portion of the substrate. Each of the light sources is configured to emit a respective primary radiation. The light-emitting unit comprises multiple wavelength conversion components, each of which may include a respective fluorescent material. Each wavelength conversion component emits a respective converted radiation, upon absorbing a portion of the primary radiation from one or more of the light sources, and mixes the respective converted radiation with a portion of the primary radiation from the one or more of the light sources that is not absorbed to form a respective mixed radiation. Each wavelength conversion component is adjacent to, and at least partially contacts, at least another one of the wavelength conversion components.

20 Claims, 6 Drawing Sheets

610

620

LIGHT-EMITTING DEVICE WITH MULTI-COLOR TEMPERATURE AND MULTI-LOOP CONFIGURATION

BACKGROUND

1. Technical Field

The present disclosure relates to a light-emitting device and, more specifically, to a light-emitting device with multi-color temperature and multi-loop configuration.

2. Description of Related Art

Dual-color temperature light-emitting packages, or devices, that are presently available on the market are typically constructed with a dam material that acts as one or more barrier walls to divide the gel in the light-emitting device into inner gel and outer phosphor layers. The inner gel typically has a generally round, or circular, outline and in some cases a polygonal outline. The outer phosphor layer encircles the inner gel and thus has a ring-like outline. The inner gel is on the inner side of a barrier wall, forming an inner circle, while the outer phosphor layer is on the outer side of the barrier wall, forming an outer ring.

Typically, when the LEDs of a dual-color temperature light-emitting device as described above are powered on, uneven mixing of the light emitted by the LEDs of two color temperatures may result. More specifically, light emitted from the inner circle tends to exhibit one color temperature and light emitted from the outer ring tends to exhibit a different color temperature. Additionally, the overall area of the packaging of conventional dual-color temperature light-emitting devices that utilize barrier walls tends to be excessively large since the barrier walls occupy a certain space. Furthermore, the undesirable situation of having spots of light with higher or lower intensity in the illumination produced by aforementioned conventional dual-color temperature light-emitting devices tends to occur.

SUMMARY

The present disclosure provides various embodiments of a light-emitting device with multi-color temperature and multi-loop configuration.

According to one aspect, a light-emitting device may comprise a substrate having a surface, a plurality of light sources disposed on the surface of the substrate, and a light-emitting unit covering the light sources and at least a portion of the surface of the substrate. Each of the light sources may be configured to emit a respective primary radiation. The light-emitting unit may comprise a plurality of wavelength conversion components. Each of the wavelength conversion components may include a respective fluorescent material. Each of the wavelength conversion components may emit a respective converted radiation, upon absorbing a portion of the primary radiation from one or more of the light sources, and may mix the respective converted radiation with a portion of the primary radiation from the one or more of the light sources that is not absorbed to form a respective mixed radiation. Each of the wavelength conversion components may be adjacent to, and may at least partially contact, at least another one of the wavelength conversion components.

In at least one embodiment, the wavelength conversion components may be arranged in a manner such that a first wavelength conversion component of the wavelength conversion components is encircled by a second wavelength conversion component of the wavelength conversion components.

In at least one embodiment, the wavelength conversion components may be arranged in a concentric configuration.

In at least one embodiment, each of the wavelength conversion components may have an outline that is generally round, elliptical or polygonal.

In at least one embodiment, at least two of the wavelength conversion components have different heights as measured from the surface of the substrate.

In at least one embodiment, a luminous center associated with a first mixed radiation formed by a first wavelength conversion component of the wavelength conversion components may substantially overlap with at least a luminous center associated with a second mixed radiation formed by a second wavelength conversion component of the wavelength conversion components.

In at least one embodiment, a sidewall of a first wavelength conversion component of the wavelength conversion components may be at least partially in contact with a sidewall of a second wavelength conversion component of the wavelength conversion components.

In at least one embodiment, each of the wavelength conversion components may be respectively formed with glue, gel or a B-stage sheet.

In at least one embodiment, a thixotropic coefficient of the gel may be approximately between 1 and 10. In at least one embodiment, the thixotropic coefficient of the gel is approximately between 1.1 and 2.

In at least one embodiment, the respective fluorescent material associated with at least one of the wavelength conversion components may comprise an aluminate fluorescent substance, a silicate fluorescent substance, a sulfide fluorescent substance, an oxynitride fluorescent substance, a nitride fluorescent substance, or a combination thereof.

In at least one embodiment, at least one of the light sources may comprise a light-emitting diode (LED) or a laser diode.

In at least one embodiment, the primary radiation emitted by at least one of the light sources may have a wavelength approximately between 420 nm and 500 nm.

In at least one embodiment, the mixed radiation formed by at least one of the wavelength conversion components may have a color temperature approximately between 2000 K and 3000 K.

In at least one embodiment, the mixed radiation formed by at least one of the wavelength conversion components may have a color temperature approximately between 4000 K and 7000 K.

In at least one embodiment, each of the wavelength conversion components may comprise a filler, a scattering agent, an oxidation inhibitor, an anti-sludging agent, a thixotropic agent, a pigment, or a combination thereof.

In at least one embodiment, the wavelength conversion components may be arranged in a multi-loop configuration with a central wavelength conversion component encircled by at least one odd-numbered-loop wavelength conversion component and at least one even-numbered-loop wavelength conversion component. The mixed radiation from each of the at least one odd-numbered-loop wavelength conversion component may have a same color temperature.

In at least one embodiment, the wavelength conversion components may be arranged in a multi-loop configuration with a central wavelength conversion component encircled by at least one odd-numbered-loop wavelength conversion component and at least one even-numbered-loop wavelength conversion component. The mixed radiation from each of the at least one even-numbered-loop wavelength conversion component may have a same color temperature.

In at least one embodiment, the wavelength conversion components may be arranged in a multi-loop configuration with a central wavelength conversion component encircled by at least one odd-numbered-loop wavelength conversion component and at least one even-numbered-loop wavelength conversion component. The mixed radiations from each of the wavelength conversion components may exhibit a gradually-increasing or gradually-decreasing trend in color temperature from the central wavelength conversion component toward the at least one even-numbered-loop wavelength conversion component.

In at least one embodiment, the substrate may comprise a ceramic substrate, a printed circuit board (PCB), or a metal substrate coated with an insulating layer.

In at least one embodiment, the light-emitting device may further comprise a heat sink.

According to another aspect, a lighting equipment may comprise a holding component and a light-emitting device attached to the holding component. The light-emitting device may comprise a substrate having a surface, a plurality of light sources disposed on the surface of the substrate, and a light-emitting unit covering the light sources and at least a portion of the surface of the substrate. Each of the light sources may be configured to emit a respective primary radiation. The light-emitting unit may comprise a plurality of wavelength conversion components. Each of the wavelength conversion components may include a respective fluorescent material. Each of the wavelength conversion components may emit a respective converted radiation, upon absorbing a portion of the primary radiation from one or more of the light sources, and may mix the respective converted radiation with a portion of the primary radiation from the one or more of the light sources that is not absorbed to form a respective mixed radiation. Each of the wavelength conversion components may be adjacent to, and may at least partially contact, at least another one of the wavelength conversion components.

Detailed description of various embodiments are provided below, with reference to the attached figures, to promote better understanding of the characteristics and benefits of the various embodiments of the present disclosure.

DETAILED DESCRIPTION OF DISCLOSED EMBODIMENTS

Overview

Figure 1:
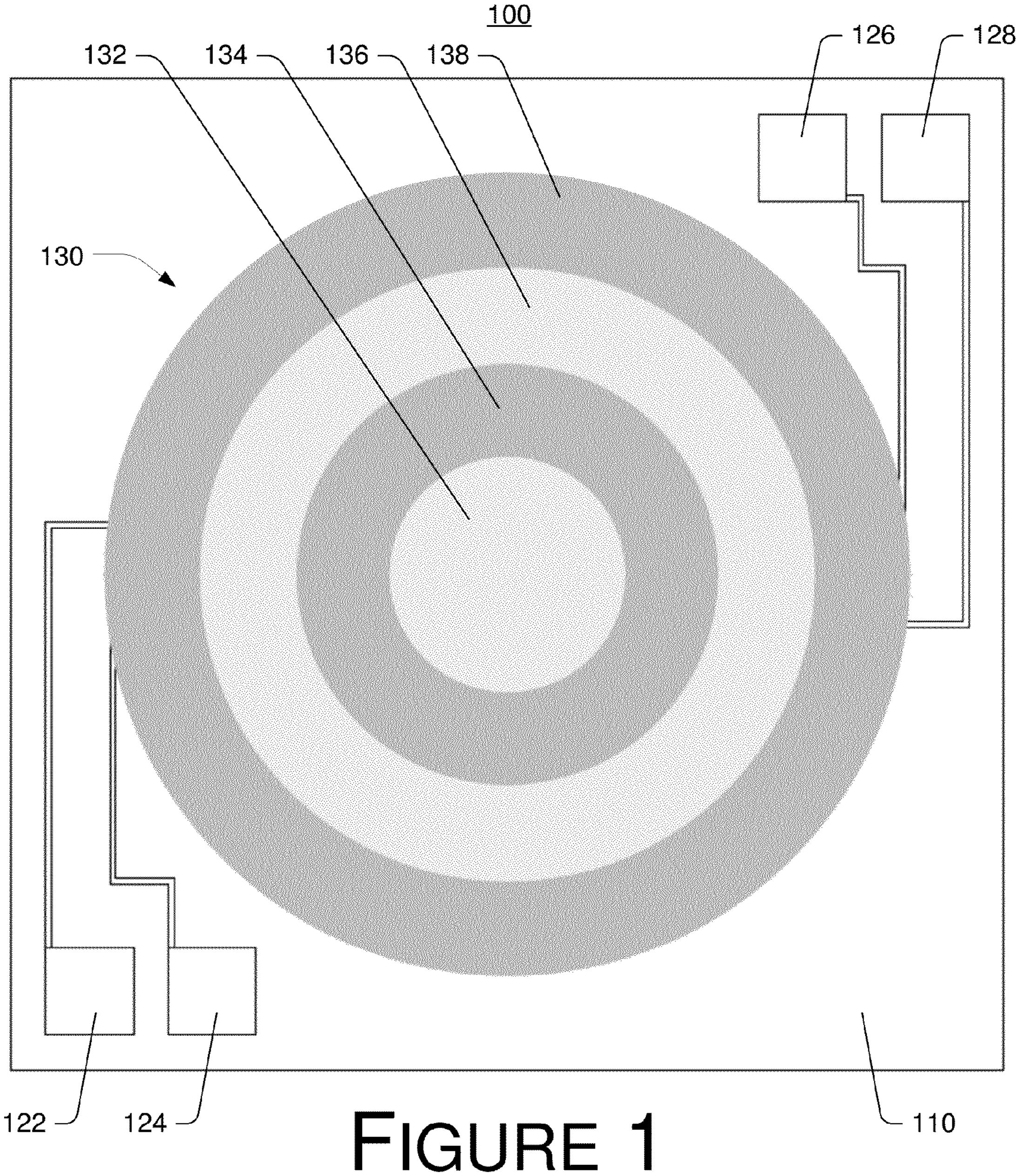
FIG. 1 is a top view of a light-emitting device with multi-color temperature and multi-loop configuration in accordance with one embodiment of the present disclosure.

Embodiments of a light-emitting device according to the present disclosure utilize glue(s), gel(s) and/or B-stage sheet(s) and light sources (e.g., LEDs) arranged in a multi-loop configuration without segregating the glue(s), gel(s) and/or B-stage sheet(s) by one or more divider. More specifically, a first group of light sources covered by glue, gel or B-stage sheet that forms a central region of a light-emitting unit of the light-emitting device, with the glue, gel or B-stage sheet acting as a wavelength conversion component for the central region of the light-emitting unit, wherein the center region may emit light with one color temperature. A second group of light sources covered by glue, gel or B-stage sheet that forms a first loop of the light-emitting unit that encircles the central region of the light-emitting unit, with the glue, gel or B-stage sheet acting as a wavelength conversion component for the first loop of the light-emitting unit, wherein the first region may emit light with another color temperature. Optionally, one or more additional loops may be similarly formed to encircle the first loop, and so on. This way, a multi-loop, dual- or multi-color temperature light-emitting device according to the present disclosure may be formed.

The radius of the central region and the width of the respect outer loops are not specifically limited in the present disclosure. In an example one-loop configuration, the central region may have a radius that is approximately half of the radius of the outline of the loop that encircles the central region. The central region may emit one color temperature while the encircling loop may emit another color temperature. In an example multi-loop configuration, the central region may have a radius that is approximately half of the radius of the outline of the outermost loop. The central region may emit two color temperatures such that, for example, a portion of the light emitted by the central region may have a first color temperature and the other portion of the light emitted by the central region may have a second color temperature. Similarly, a portion of the light emitted by the encircling loops may have the first color temperature and the other portion of the light emitted by the encircling loops may have the second color temperature. Given that no divider, or barrier wall, is used to segregate the central region and the encircling loop(s) from each other, the resulting light of the light-emitting device is mixed more evenly compared to the resulting light emitted by conventional dual-color temperature light-emitting devices.

Although embodiments shown in the present disclosure pertain to a light-emitting device with a central region having a generally round outline, the central region may have an outline of a different shape in various other embodiments. For example, in some embodiments the central region may have an outline that is generally elliptical or polygonal. Further, although embodiments shown in the present disclosure include one or more loops that are concentric with respect to the central region, in other embodiments the one or more loops may be off-concentric with respect to the central region.

The light-emitting device of various embodiments of the present disclosure may be employed in applications such as, for example, indoor lighting and outdoor lighting, including: flashlight, ceiling chandelier, roadside lighting fixture, etc.

Example Embodiments

FIG. 1 illustrates a top view of a light-emitting device 100 in accordance with one embodiment of the present disclosure.

Figure 2:
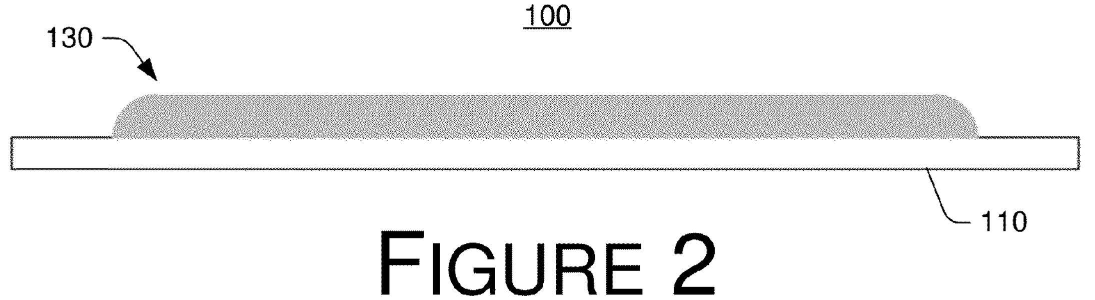
FIG. 2 is a side view of the light-emitting device of FIG. 1.
Figure 3:
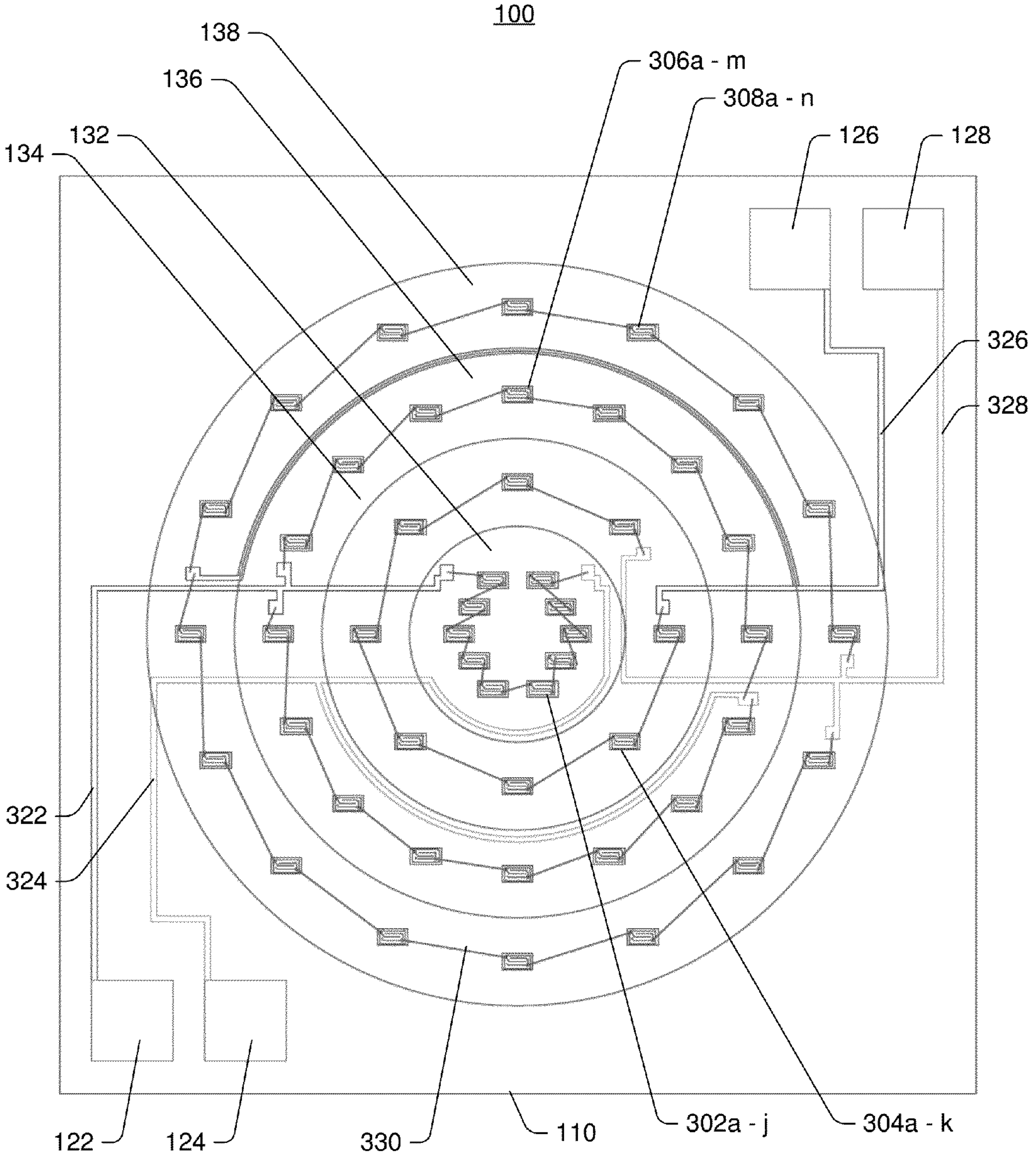
FIG. 3 is a schematic diagram of the light-emitting device of FIG. 1.

FIG. 2 illustrates a side view of the light-emitting device 100. FIG. 3 illustrates a schematic diagram of the light-emitting device 100. The following description of the light-emitting device 100 pertains to FIGS. 1-3.

In one embodiment, the light-emitting device 100 may comprise a substrate 110 having a main surface (i.e., the surface of the substrate 110 that faces the reader), multiple light sources 302*a-j*, 304*a-k*, 306*a-m* and 308*a-n*, and a light-emitting unit 130. The parameters a, j, k, m and n used herein are positive integers greater than zero. The light sources 302*a-j*, 304*a-k*, 306*a-m* and 308*a-n* may be disposed on the main surface of the substrate 110. The light-emitting unit 130 may cover the light sources 302*a-j*, 304*a-k*, 306*a-m* and 308*a-n* and at least a portion of the main surface of the substrate 110. Each of the light sources 302*a-j*, 304*a-k*, 306*a-m* and 308*a-n* may be configured to emit a respective primary radiation. The light-emitting unit 130 may comprise multiple wavelength conversion components 132, 134, 136 and 138. It would be appreciated by those ordinarily skilled in the art that, although the illustrated embodiment includes four wavelength conversion components, other embodiments may include a different number of wavelength conversion components depending on the actual number of loops in implementation.

Each of the wavelength conversion components 132, 134, 136 and 138 may respectively comprise one or more fluorescent materials. For example, while one or more of the wavelength conversion components 132, 134, 136 and 138 may include one fluorescent material, one or more other wavelength conversion components 132, 134, 136 and 138 may include another fluorescent material. That is, two or more fluorescent materials may be utilized in the light-emitting device 100.

Each of the wavelength conversion components 132, 134, 136 and 138 may emit a respective converted radiation, upon absorbing a portion of the primary radiation from one or more of the light sources 302*a-j*, 304*a-k*, 306*a-m* and 308*a-n*, and may mix the respective converted radiation with a portion of the primary radiation from the one or more of the light sources 302*a-j*, 304*a-k*, 306*a-m* and 308*a-n* that is not absorbed to form a respective mixed radiation. Each of the wavelength conversion components 132, 134, 136 and 138 may be adjacent to, and may be at least partially in contact with, at least another one of the wavelength conversion components 132, 134, 136 and 138.

For example, when each of the wavelength conversion components 132, 134, 136 and 138 is formed with gel or B-stage sheet, each of the wavelength conversion components 132, 134, 136 and 138 (whether formed with glue, gel or B-stage sheet) has a physical height and sides, or sidewalls. In at least one embodiment, at least two of the wavelength conversion components 132, 134, 136 and 138 have different heights as measured from the main surface of the substrate 110. When each of the wavelength conversion components 132, 134, 136 and 138 is not segregated from each other by a barrier wall or a divider, as with conventional dual-color temperature light-emitting devices, a sidewall of each of the wavelength conversion components 132, 134, 136 and 138 is in physical contact with the sidewall of at least an adjacent one of the wavelength conversion components 132, 134, 136 and 138. Even in the case where each of the wavelength conversion components 132, 134, 136 and 138 is partially segregated from each other by one or more dividers (e.g., the height of the one or more dividers is less than the height of each of the wavelength conversion components 132, 134, 136 and 138), a lower portion of the sidewall of each of the wavelength conversion components 132, 134, 136 and 138 may be separated from and not in physical contact with the sidewall of an adjacent one of the wavelength conversion components 132, 134, 136 and 138. However, an upper portion of the sidewall of each of the wavelength conversion components 132, 134, 136 and 138 may still be in physical contact with the sidewall of an adjacent one of the wavelength conversion components 132, 134, 136 and 138 in accordance with the present disclosure.

In the embodiment shown in FIGS. 1-3, the wavelength conversion component 132 forms the central region of the light-emitting unit 130. The wavelength conversion component 134 forms the first loop of the light-emitting unit 130. Additionally, the wavelength conversion component 136 forms the second loop of the light-emitting unit 130. Similarly, the wavelength conversion component 138 forms the third loop of the light-emitting unit 130.

The light-emitting device 100 may further include electrodes 122, 124, 126 and 128, and electrically conductive patterns 322, 324, 326, 328 and 330. The light sources 302*a-j*, covered by the central region of the light-emitting unit 130, and the light sources 306*a-m*, covered by the second loop of the light-emitting unit 130, may receive electrical power from an external power source via the electrodes 122 and 124 as well as the electrically conductive patterns 322 and 324. The light sources 304*a-k*, covered by the first loop of the light-emitting unit 130, and the light sources 308*a-n*, covered by the third loop of the light-emitting unit 130, may receive electrical power from the same or a different external power source via the electrodes 126 and 128 as well as the electrically conductive patterns 326 and 328. Each of the light sources 302*a-j* may be electrically connected to at least one other light source 302*a-j* via one of the electrically conductive wires 330. Each of the light sources 304*a-k* may be electrically connected to at least one other light source 304*a-k* via one of the electrically conductive wires 330. Each of the light sources 306*a-m* may be electrically connected to at least one other light source 306*a-m* via one of the electrically conductive wires 330. Each of the light sources 308*a-n* may be electrically connected to at least one other light source 308*a-n* via one of the electrically conductive wires 330. Thus, the light sources 302*a-j* and 306*a-m* may be powered on and off together, and the light sources 304*a-k* and 308*a-n* may be powered on and off together. In other words, the light-emitting device 100 includes two sets of circuits for supplying electrical power to the light sources 302*a-j*, 304*a-k*, 306*a-m* and 308*a-n*. FIG. 3 illustrates a top view of a schematic diagram of the light-emitting device 100, viewed in a direction perpendicular to the main surface of the substrate 110 of the light-emitting device 100. Although FIG. 3 shows that the light sources covered by one wavelength conversion component are connected in series, it would be appreciated by those ordinarily skilled in the art that the sources may be connect in parallel or in a series-parallel arrangement.

In the embodiment shown in FIGS. 1-3, the central region of the light-emitting unit 130, or wavelength conversion component 132, has a radius that is half of the radius of the outline of the first loop of the light-emitting unit 130, or wavelength conversion component 134, which is approximately half of the radius of the outline of the third loop of the light-emitting unit 130, or wavelength conversion component 138. The radius of the outline of the second loop of the light-emitting unit 130, or wavelength conversion component 136, is midway between the radii of the outlines of the first loop and the third loop.

By powering the lighting sources underneath, the central region of the light-emitting unit 130, may emit a first color temperature, and the first loop of the light-emitting unit 130 may emit a second color temperature that is different from the first color temperature. The second loop of the light-emitting unit 130 may emit the first color temperature, and the third loop of the light-emitting unit 130 may emit the second color temperature. Accordingly, the resulting light may be mixed more evenly compared to the resulting light emitted by a conventional dual-color temperature light-emitting device.

In at least one embodiment, the wavelength conversion components 132, 134, 136 and 138 may be arranged in a manner such that a first wavelength conversion component of the wavelength conversion components is encircled by a second wavelength conversion component of the wavelength conversion components. In the embodiment shown in FIGS. 1-3, the wavelength conversion components 132, 134, 136 and 138 are arranged in a multi-loop configuration, with the wavelength conversion components 132 forming the central region of the light-emitting unit 130, the wavelength conversion components 134 forming the first loop of the light-emitting unit 130, the wavelength conversion components 136 forming the second loop of the light-emitting unit 130, and the wavelength conversion components 138 forming the third loop of the light-emitting unit 130.

In at least one embodiment, the wavelength conversion components 132, 134, 136 and 138 may be arranged in a concentric configuration. In the embodiment shown in FIGS. 1-3, with the wavelength conversion component 132 forming the central region of the light-emitting unit 130, the loops formed by the wavelength conversion components 134, 136 and 138 are concentric with respect to the central region formed by the wavelength conversion component 132. Alternatively, in some embodiments, at least one but not all of the loops may be concentric with respect to the central region of the light-emitting unit 130. Alternatively, in some embodiments, one or more of the loops may be eccentric with respect to the central region of the light-emitting unit 130. Alternatively, in other embodiments, one or more of the loops may be concentric with respect to at least one other loop but not with respect to the central region.

In at least one embodiment, each of the wavelength conversion components 132, 134, 136 and 138 may have an outline that is generally round, elliptical or polygonal. In the embodiment shown in FIGS. 1-3, each of the wavelength conversion components 132, 134, 136 and 138 has an outline that is generally round.

Each mixed radiation associated with the respect wavelength conversion component has a light intensity profile while projected to a projection screen at a distance of 1 meter. In at least one embodiment, a luminous center (i.e., a highest value of the light intensity profile) associated with a first mixed radiation formed by a first wavelength conversion component of the wavelength conversion components 132, 134, 136 and 138 may substantially overlap with at least a luminous center associated with a second mixed radiation formed by a second wavelength conversion component of the wavelength conversion components 132, 134, 136 and 138. For example, with the wavelength conversion components 132, 134, 136 and 138 being concentric with each other as shown in FIGS. 1-3, the luminous center of the mixed radiation formed by at least the wavelength conversion components 132 and 134, if not also 136 and 138, tend to overlap.

In at least one embodiment, a sidewall of a first wavelength conversion component of the wavelength conversion components 132, 134, 136 and 138 may be substantially or at least partially in contact with a sidewall of a second wavelength conversion component of the wavelength conversion components 132, 134, 136 and 138. In the embodiment shown in FIGS. 1-3, each of the wavelength conversion components 132, 134, 136 and 138 is not segregated from each other by a divider, as with conventional dual-color temperature light-emitting devices, a sidewall of each of the wavelength conversion components 132, 134, 136 and 138 is in physical contact with the sidewall of at least an adjacent one of the wavelength conversion components 132, 134, 136 and 138.

In at least one embodiment, each of the wavelength conversion components 132, 134, 136 and 138 may be respectively formed with glue, gel or B-stage sheets that respectively include one or more fluorescent materials. The glue may be a resin composition having a high fluidity. The glue may be a polymer composition having high fluidity. The gel may be a polymer composition having low fluidity and can maintain in a certain shape for a period at room temperature, preferably has a thixotropic coefficient approximately between 1 and 10, and more preferably has the thixotropic coefficient approximately from 1.1 to 2 under two test speeds, 10 rpm and 100 rpm, at 25° C. with a viscometer. In the present disclosure, the thixotropic coefficient was determined with the viscometer available from BROOKFIELD (trade mark: HBDV-II$^{+}$P®). The B-stage sheet may be a polymer sheet that has been cured into B-stage while it has a certain mechanical property to maintain its shape, preferably has a Shore hardness approximately between Shore A 30 and Shore D 30.

In at least one embodiment, the one or more fluorescent materials associated with at least one of the wavelength conversion components 132, 134, 136 and 138 may comprise an aluminate fluorescent substance (such as a doped yttrium-aluminum-oxide compound, a doped lutetium-aluminum-oxide compound, a doped terbium-aluminum-oxide compound or a combination thereof), a silicate fluorescent substance, a sulfide fluorescent substance, an oxynitride fluorescent substance, a nitride fluorescent substance, or a combination thereof.

In at least one embodiment, at least one of the light sources 302*a-j*, 304*a-k*, 306*a-m* and 308*a-n* may comprise an LED or a laser diode; preferably all the light sources are LED. In at least one embodiment, the primary radiation emitted by at least one of the light sources 302*a-j*, 304*a-k*, 306*a-m* and 308*a-n* may have a wavelength approximately between 420 nm and 500 nm. The light sources 302*a-j*, 304*a-k*, 306*a-m* and 308*a-n* may be the same as or different from each other, and may emit light with the same or different wavelength profile. It should be noted that even though each light source emits the primary radiation with different wavelength profile, the light sources may still have the same or different main peak.

In at least one embodiment, the mixed radiation formed by at least one of the wavelength conversion components 132, 134, 136 and 138 may have a color temperature approximately between 2000 degrees Kelvin (K) and 3000 K (cold white color). In yet at least one embodiment, the mixed radiation formed by at least one of the wavelength conversion components 132, 134, 136 and 138 may have a color temperature approximately between 4000 K and 7000 K (warm white color). In a preferred embodiment, the wavelength conversion components 132, 134, 136 and 138 have an alternating arrangement with cold white color and warm white color.

In at least one embodiment, each of the wavelength conversion components 132, 134, 136 and 138 may comprise a filler, a scattering agent, an oxidation inhibitor, an anti-sludging agent, a thixotropic agent, a pigment, or a combination thereof.

In at least one embodiment, the wavelength conversion components 132, 134, 136 and 138 may be arranged in a multi-loop configuration with a central wavelength conversion component encircled by at least one odd-numbered-loop wavelength conversion component and at least one even-numbered-loop wavelength conversion component. The mixed radiation formed by each of the at least one odd-numbered-loop wavelength conversion component may have a same color temperature. The width of the at least one odd-numbered-loop wavelength conversion component may be approximately half of the width of the at least one even-numbered-loop wavelength conversion component. In yet at least one embodiment, the wavelength conversion components 132, 134, 136 and 138 may be arranged in a multi-loop configuration with a central wavelength conversion component encircled by at least one odd-numbered-loop wavelength conversion component and at least one even-numbered-loop wavelength conversion component. The mixed radiation formed by each of the at least one even-numbered-loop wavelength conversion component may have a same color temperature. The width of the at least one odd-numbered-loop wavelength conversion component may be approximately half of the width of the at least one even-numbered-loop wavelength conversion component.

In at least one embodiment, the wavelength conversion components 132, 134, 136 and 138 may be arranged in a multi-loop configuration with a central wavelength conversion component encircled by at least one odd-numbered-loop wavelength conversion component and at least one even-numbered-loop wavelength conversion component. The mixed radiations from the wavelength conversion components 132, 134, 136 and 138 may exhibit a gradually-increasing or gradually-decreasing trend in color temperature from the central wavelength conversion component toward the at least one even-numbered-loop wavelength conversion component. In at least one embodiment, each of the wavelength conversion components 132, 134, 136 and 138 may emit a respective color temperature that is different from the color temperatures emitted by the other ones of the wavelength conversion components 132, 134, 136 and 138. The width of the at least one odd-numbered-loop wavelength conversion component may be approximately half of the width of the at least one even-numbered-loop wavelength conversion component.

In at least one embodiment, the substrate 110 may comprise a ceramic substrate, a printed circuit board (PCB), or a metal substrate coated with an insulating layer. In yet at least one embodiment, the light-emitting device 100 may further comprise a heat sink. For example, a heat sink may be attached, mounted, affixed, or otherwise coupled to the substrate 110 to aid dissipation of heat generated by the light sources 302_a-j_, 304_a-k_, 306_a-m_ and 308_a-n_. The heat sink may include a metallic block or a ceramic block.

Figure 8:
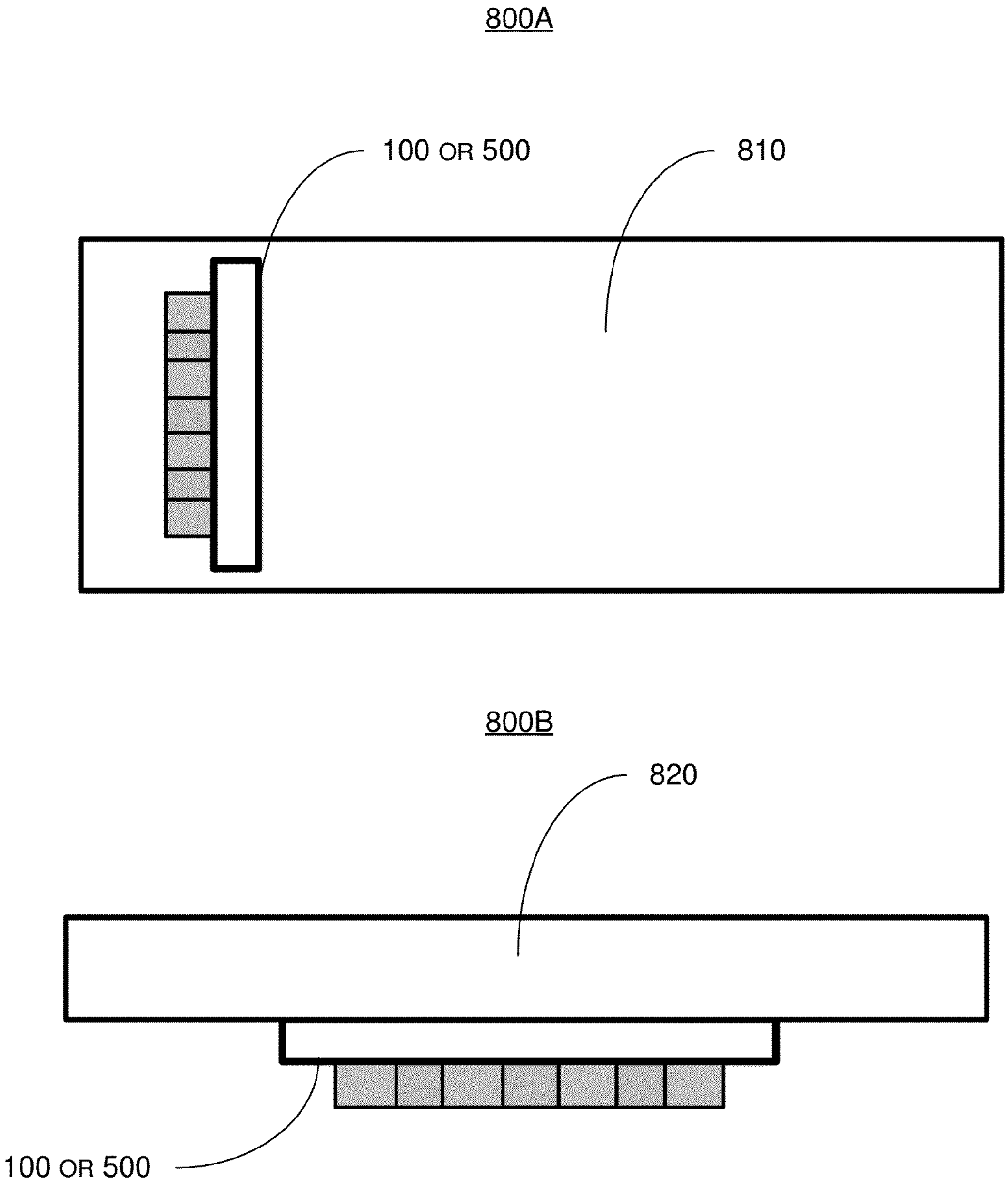
FIG. 8 shows a cross-sectional view of example implementations of a lighting equipment in accordance with two embodiments of the present disclosure.

The light-emitting device of various embodiments of the present disclosure may be employed in a wide variety of applications. Regardless what the application may be, a lighting equipment in accordance with the present disclosure may include a holding component and a light-emitting device, such as the light-emitting device 100 or the light-emitting device 500, which is attached to the holding component. FIG. 8 illustrates a cross-sectional view of lighting equipment 800A and lighting equipment 800B in accordance with two embodiments of the present disclosure. The lighting equipment may be, for example, flashlight, ceiling chandelier, or roadside lighting fixture. For example, lighting equipment 800A may be a flashlight including a holding component 810 that may be the casing of the flashlight, and a light-emitting device 100 or 500 may be attached to the holding component 810. As another example, lighting equipment 800B may be a ceiling chandelier including a holding component 820 that may be a ceiling board, and a light-emitting device 100 or 500 may be attached to the holding component 820. When the lighting equipment 800A or 800B is a roadside lighting fixture, the holding component 810 or 820 may be a lamp body of the lighting fixture. It would be appreciated by those ordinarily skilled in the art that, although certain examples are provided herein, any other suitable applications in which a light-emitting device of the present disclosure are possible and hence are within the spirit and scope of the present disclosure.

Figure 4:
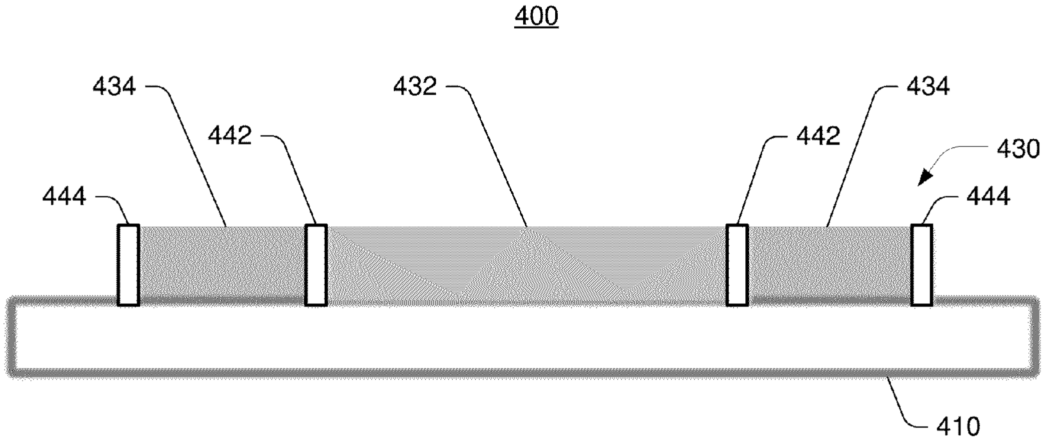
FIG. 4 is a side view of a conventional dual-color temperature light-emitting device.
Figure 5:
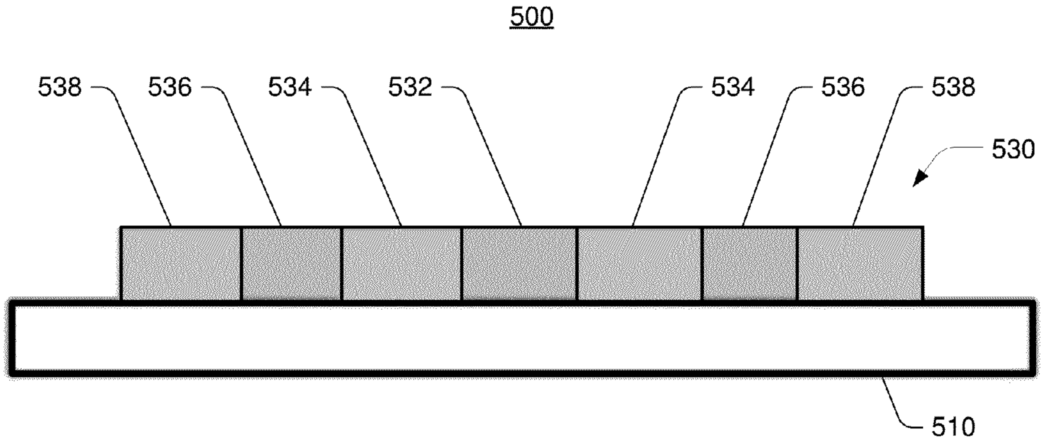
FIG. 5 is a side view of a light-emitting device with multi-color temperature and multi-loop configuration in accordance with one embodiment of the present disclosure.

FIG. 4 illustrates a side view of a conventional dual-color temperature light-emitting device 400. FIG. 5 illustrates a side view of a light-emitting device 500 in accordance with one embodiment of the present disclosure. The following description pertains to FIGS. 4 and 5.

The dual-color temperature light-emitting device 400 is representative of conventional dual-color temperature light-emitting devices. As shown in FIG. 4, the light-emitting device 400 includes substrate 410 and a light-emitting unit 430. The light-emitting unit 430 includes a central wavelength conversion component 432 and a peripheral wavelength conversion component 434 that encircles the central wavelength conversion component 432. The central wavelength conversion component 432 and the peripheral wavelength conversion component 434 are segregated by a divider 442. That is, the sidewall of the central wavelength conversion component 432 is not in physical contact with the inner sidewall of the peripheral wavelength conversion component 434. On the other hand, the outer sidewall of the peripheral wavelength conversion component 434 is in physical contact with a divider 444.

The light-emitting device 500 may be representative of the light-emitting device 100 of FIGS. 1-3. The light-emitting device 500 includes substrate 510 and a light-emitting unit 530. The light-emitting unit 530 includes a central wavelength conversion component 532 and encircling wavelength conversion component 534, 536 and 538 that encircle the central wavelength conversion component 532. Unlike the light-emitting device 400, in the light-emitting device 500 the wavelength conversion components 532, 534, 536 and 538 are not segregated from each other. That is, the sidewall of the central wavelength conversion component 432 is in physical contact with the inner sidewall of the encircling wavelength conversion component 534. The outer sidewall of the encircling wavelength conversion component 534 is in physical contact with the inner sidewall of the encircling wavelength conversion component 536. The outer sidewall of the encircling wavelength conversion component 536 is in physical contact with the inner sidewall of the encircling wavelength conversion component 538. Given that no divider is used to segregate the wavelength conversion components 532, 534, 536 and 538 from each other, the resulting light of the light-emitting device 500 is mixed more evenly compared to the resulting light emitted by the light-emitting device 400. Furthermore, the undesirable situation of having spots of light with higher or lower intensity in the illumination produced by conventional dual-color temperature light-emitting devices can be avoided in the case of the light-emitting device 500.

Figure 6:
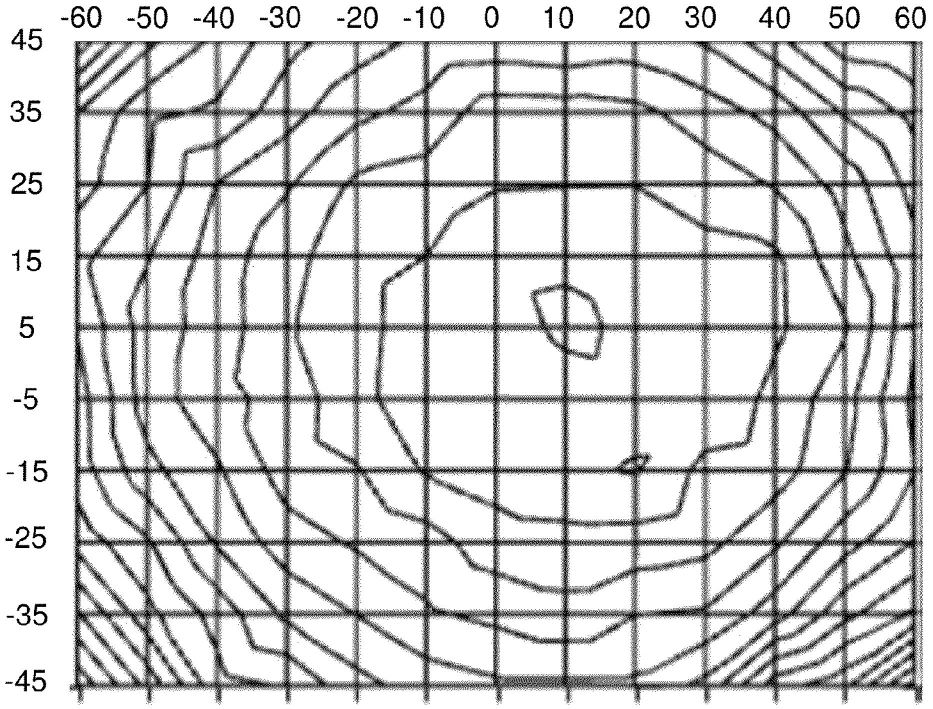
FIG. 6 shows a comparison of color temperature distributions of a conventional dual-color temperature light-emitting device and a light-emitting device with multi-color temperature and multi-loop configuration in accordance with one embodiment of the present disclosure.
Figure 6:
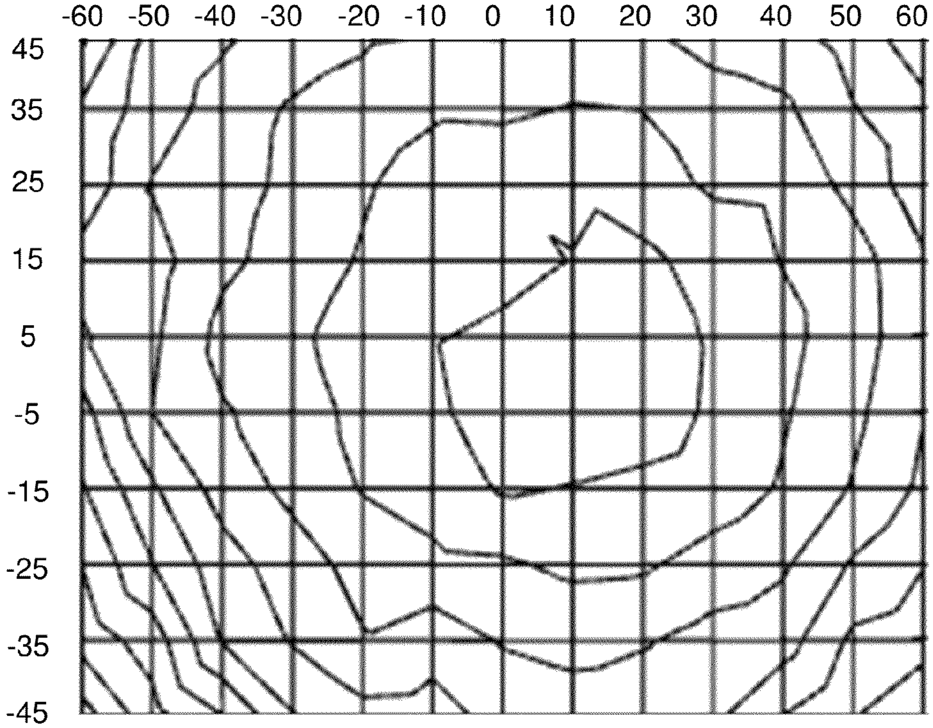

FIG. 6 illustrates a comparison of color temperature distributions of the conventional dual-color temperature light-emitting device 400 and the light-emitting device 500 in accordance with one embodiment of the present disclosure.

Color temperature distribution chart 610 is associated with the conventional light-emitting device 400 and color temperature distribution chart 620 is associated with the light-emitting device 500. The temperature difference between two adjacent lines in the charts is 50 K. As can be seen in FIG. 6, the color temperature distribution associated with the conventional light-emitting device 400 has an offset that is more intense than that of the color temperature distribution associated with the light-emitting device 500. Moreover, as shown in FIG. 6, uniformity in the color temperature associated with the light-emitting device 500 is superior to that associated with the conventional light-emitting device 400.

Example Method of Fabrication

Figure 7:
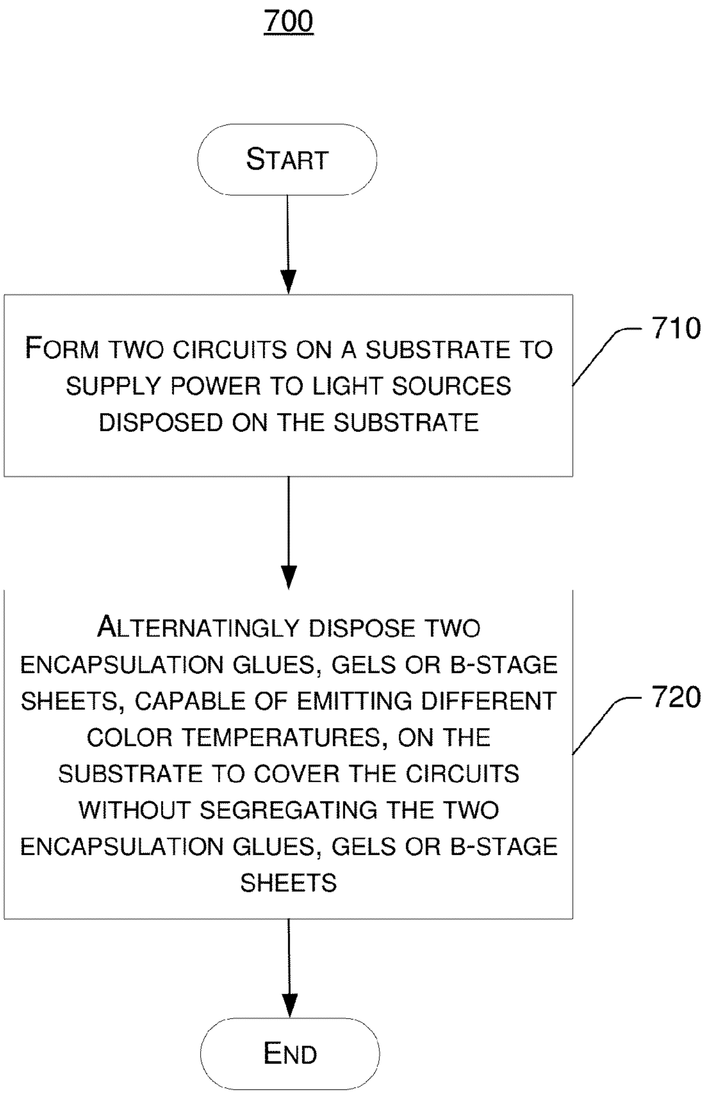
FIG. 7 is a flowchart showing a process of fabrication of a light-emitting device with multi-color temperature and multi-loop configuration in accordance with one embodiment of the present disclosure.

FIG. 7 illustrates a flowchart showing a process 700 of fabrication of a light-emitting device with multi-color temperature and multi-loop configuration in accordance with one embodiment of the present disclosure.

In 710, two circuits are formed on a substrate to supply electrical power to light sources that are disposed on the substrate. For example, as shown in FIGS. 1-3, two separate circuits are formed on the substrate 110 to supply electrical power to light sources 302*a-j*, 304*a-k*, 306*a-m* and 308*a-n*.

In 720, two glues, gels or B-stage sheets capable of emitting different color temperatures are alternatingly disposed on the substrate to cover the circuits to form wavelength conversion components, whereas the two glues, gels or B-stage sheets are not segregated from one another by a divider. In the embodiment shown in FIGS. 1-3, the wavelength conversion components 132 and 136 may, for example, include a gel of one color temperature, while the wavelength conversion components 134 and 138 may include a different gel of another color temperature.

In one embodiment, a fluorescent gel or a fluorescent B-stage sheet, while capable of permanently or temporarily maintaining its shape, may be disposed on the substrate to cover the circuits to form multiple annular bodies, or loops, in a manner such that the loops are formed from the inside out loop-by-loop. Alternatively, the loops may be disposed from the outside in loop-by-loop. After the loops are formed, heat treatment may be carried out to cure the gel or B-stage sheet. When gel is used, the thixotropic coefficient of the gel is approximately between 1 and 10, and preferably approximately between 1 and 2. In one embodiment, when the loops are formed with a gel, a pre-heat treatment may be carried out after a certain number of loops have been formed so as to enhance the mechanical strength of the loops already formed.

In one embodiment, multiple loops that are separate from each other may be respectively formed with a fluorescent gel or a fluorescent B-stage sheet. Next, the cavities between each pair of neighboring loops, as well as the cavity within the innermost loop, are filled with a fluorescent glue of high fluidity so that the fluorescent glue may spread and in contact with the loops. Afterwards, a heat treatment is carried out. Preferably, after the separate loops are formed and before the glue is filled into the cavities, a pre-heat treatment may be carried out to enhance the mechanical strength of the loops. In such a manner, the wavelength conversion components formed by glue may have a height less than that formed by the gel or B-stage sheet.

In one embodiment, the techniques described in the previous two paragraphs may be used in combination. When gel is used to form the wavelength conversion components, the height of at least one of the wavelength conversion components is less than the height of one or more of the other wavelength conversion components.

ADDITIONAL NOTES AND CONCLUSION

In summary, embodiments of a light-emitting device according to the present disclosure utilize wavelength conversion components and light sources of two or more color temperatures arranged in a multi-loop configuration without segregating the wavelength conversion components by one or more divider. Given that no divider is used to segregate the wavelength conversion components from each other, the resulting light of the light-emitting device is mixed more evenly compared to the resulting light emitted by conventional dual-color temperature light-emitting devices. Furthermore, the undesirable situation of having spots of light with higher or lower intensity in the illumination produced by conventional dual-color temperature light-emitting devices can be avoided with a light-emitting device of the present disclosure.

It is specifically contemplated that any feature disclosed herein with respect to one embodiment or one figure of the present disclosure may apply to any other embodiment of the present disclosure. More specifically, although any given feature may be described above in connection with one or more particular embodiments or figures, such feature may be applied in any combination with any other feature with respect to all other embodiments and figures, and variations thereof, without departing from the spirit of the present disclosure and so long as such feature does not contradict with one or more features of the other embodiments and figures.

Although a number of embodiments of the present disclosure are described above, the scope of the present disclosure is not and cannot be limited to the disclosed embodiments. More specifically, one ordinarily skilled in the art may make various deviations and improvements based on the disclosed embodiments, and such deviations and improvements are still within the scope of the present disclosure. Accordingly, the scope of protection of a patent issued from the present disclosure is determined by the claims provided below.

What is claimed is:

1. A light-emitting device, comprising:

a substrate having a surface;

a plurality of light sources disposed on the surface of the substrate, each of the light sources configured to emit a primary radiation; and a light-emitting unit covering the light sources and at least a portion of the surface of the substrate, the light-emitting unit comprising a plurality of wavelength conversion components, wherein:

each of the wavelength conversion components covers at least one light source of the plurality of light sources such that each of the wavelength conversion components is directly over at least one of the light sources when viewed in a direction perpendicular to the surface of the substrate;

each of the wavelength conversion components includes a respective fluorescent material;

each of the wavelength conversion components emits a respective converted radiation, upon absorbing a portion of the primary radiation from one or more of the light sources, and mixes the respective converted radiation with a portion of the primary radiation from the one or more of the light sources that is not absorbed to form a respective mixed radiation; and each of the wavelength conversion components is adjacent to, and at least partially in contact with, at least another one of the wavelength conversion components such that a sidewall of a first wavelength conversion component of the plurality of wavelength conversion components is in direct contact with a sidewall of a second wavelength conversion component of the plurality of wavelength conversion components with no barrier or divider therebetween.

2. The light-emitting device of claim 1, wherein the wavelength conversion components are arranged in a manner such that a first wavelength conversion component of the wavelength conversion components is encircled by a second wavelength conversion component of the wavelength conversion components.

3. The light-emitting device of claim 1, wherein the wavelength conversion components are arranged in a concentric configuration.

4. The light-emitting device of claim 1, wherein each of the wavelength conversion components has an outline that is generally round, elliptical or polygonal.

5. The light-emitting device of claim 1, wherein at least two of the wavelength conversion components have different heights.

6. The light-emitting device of claim 1, wherein a sidewall of a first wavelength conversion component of the wavelength conversion components is in contact with a sidewall of a second wavelength conversion component of the wavelength conversion components.

7. The light-emitting device of claim 1, wherein each of the wavelength conversion components are respectively formed with glue, gel or a B-stage sheet.

8. The light-emitting device of claim 7, wherein a thixotropic coefficient of the gel is approximately between 1 and 10.

9. The light-emitting device of claim 8, wherein the thixotropic coefficient of the gel is approximately between 1.1 and 2.

10. The light-emitting device of claim 1, wherein the respective fluorescent material associated with at least one of the wavelength conversion components comprises an aluminate fluorescent substance, a silicate fluorescent substance, a sulfide fluorescent substance, an oxynitride fluorescent substance, a nitride fluorescent substance, or a combination thereof.

11. The light-emitting device of claim 10, wherein the aluminate fluorescent substance comprises a doped yttrium-aluminum-oxide compound, a doped lutetium-aluminum-oxide compound, a doped terbium-aluminum-oxide compound, or a combination thereof.

12. The light-emitting device of claim 1, wherein at least one of the light sources comprises a light-emitting diode (LED) or a laser diode.

13. The light-emitting device of claim 1, wherein the primary radiation emitted by at least one of the light sources has a wavelength approximately between 420 nm and 500 nm.

14. The light-emitting device of claim 1, wherein the mixed radiation formed by at least one of the wavelength conversion components has a color temperature approximately between 2000 K and 3000 K.

15. The light-emitting device of claim 1, wherein the mixed radiation formed by at least one of the wavelength conversion components has a color temperature approximately between 4000 K and 7000 K.

16. The light-emitting device of claim 1, wherein each of the wavelength conversion components comprises a filler, a scattering agent, an oxidation inhibitor, an anti-sludging agent, a thixotropic agent, a pigment, or a combination thereof.

17. The light-emitting device of claim 1, wherein the wavelength conversion components are arranged in a multi-loop configuration with a central wavelength conversion component encircled by at least one odd-numbered-loop wavelength conversion component and at least one even-numbered-loop wavelength conversion component, and wherein the mixed radiation formed by each of the at least one odd-numbered-loop wavelength conversion component has a same color temperature.

18. The light-emitting device of claim 1, wherein the wavelength conversion components are arranged in a multi-loop configuration with a central wavelength conversion component encircled by at least one odd-numbered-loop wavelength conversion component and at least one even-numbered-loop wavelength conversion component, and wherein the mixed radiation formed by each of the at least one even-numbered-loop wavelength conversion component has a same color temperature.

19. The light-emitting device of claim 1, wherein the wavelength conversion components are arranged in a multi-loop configuration with a central wavelength conversion component encircled by at least one odd-numbered-loop wavelength conversion component and at least one even-numbered-loop wavelength conversion component, and wherein the mixed radiations formed by the wavelength conversion components exhibit a gradually-increasing or gradually-decreasing trend in color temperature from the central wavelength conversion component toward the at least one even-numbered-loop wavelength conversion component.

20. A lighting equipment, comprising:
- a holding component; and
- a light-emitting device attached to the holding component, the light-emitting device comprising:
  - a substrate having a surface;
  - a plurality of light sources disposed on the surface of the substrate, each of the light sources configured to emit a respective primary radiation; and
  - a light-emitting unit covering the light sources and at least a portion of the surface of the substrate, the light-emitting unit comprising a plurality of wavelength conversion components, wherein:
    - each of the wavelength conversion components covers at least one light source of the plurality of light sources such that each of the wavelength conversion components is directly over at least one of the light sources when viewed in a direction perpendicular to the surface of the substrate;
  - each of the wavelength conversion components includes a respective fluorescent material;
  - each of the wavelength conversion components emits a respective converted radiation, upon absorbing a portion of the primary radiation from one or more of the light sources, and mixes the respective converted radiation with a portion of the primary radiation from the one or more of the light sources that is not absorbed to form a respective mixed radiation; and
  - each of the wavelength conversion components is adjacent to, and at least partially contacts, at least another one of the wavelength conversion components such that a sidewall of a first wavelength conversion component of the plurality of wavelength conversion components is in direct contact with a sidewall of a second wavelength conversion component of the plurality of wavelength conversion components.

* * * * *